TWISTED PAIR TRANSMISSION SYSTEM

Filed July 8, 1964 2 Sheets-Sheet 1

INVENTOR
LESTER T. DAVIS
BY Cushman, Darby & Cushman
ATTORNEYS

TWISTED PAIR TRANSMISSION SYSTEM

Filed July 8, 1964 2 Sheets-Sheet 2

INVENTOR
LESTER T. DAVIS

BY Cushman, Darby & Cushman
ATTORNEYS

United States Patent Office 3,381,236
Patented Apr. 30, 1968

3,381,236

TWISTED PAIR TRANSMISSION SYSTEM

Lester T. Davis, Chippewa Falls, Wis., assignor to Control Data Corporation, Minneapolis, Minn., a corporation of Minnesota Filed July 8, 1964, Ser. No. 381,041
5 Claims. (Cl. 330—53)

ABSTRACT OF THE DISCLOSURE

A twisted wire transmission system including a bilevel amplifier driver with a non-linear impedance network shunted across its output, a twisted pair transmission line directly coupled to the bilevel amplifier driver and a bilevel receiver directly coupled to the other end of the transmission line. The receiver has an input impedance greater than the transmission line characteristic impedance so that a substantial portion of the received signal is reflected back along the transmission line and then shunted to ground by the non-linear impedance, thereby holding the line voltage level relatively constant.

This invention is directed towards a twisted pair transmission system for interconnecting electrical components in a high sped digital computer and more particularly to a twisted pair transmission line and driver for interconnecting transistor circuits.

Presently, modern high speed digital computers utilize transistors which are capable of switching from their saturation state to their cut-off state in nanonseconds of time. Coupled with this high speed capability, computers have a large number of electrical components and circuitry yielding systems which can process voluminous quantities of complex data in a minimum time.

As the state of the art relating to digital computers has been advanced, improved and extended, a limitation encountered encumbering the speed of operation has been the time required for an electrical signal to traverse a wire conductor interconnecting electrical circuits. When a computer is to operate in the nanosecond range, excessive wire length and timing of electrical signals become critical factors.

These critical factors have resulted in new computer packaging techniques and high speed transmission lines and driving circuits, both of which directly lessen the effects of these limitations. The packaging techniques include compact modular designs which result in bringing electrical components physically in close proximity with each other to directly reduce the length of the interconnecting wires. Further, the high speed transmission lines and driving circuits must be improved to provide fast switching operations while maintaining a light loading on the driving circuit.

When an electrical circuit utilizes several transistor components, all of which are physically mounted or located on a common printed circuit board, the interconnecting of the transistors does not present a problem from the transmission line viewpoint because of their close physical proximity. A basic circuit or a plurality of circuits mounted on a common printed circuit board may be referred to as a module. Further, these modules may be mounted on chassis. Thus, two transmission line interconnections must be provided: (a) interconnections between modules on a common chassis; and (b) interconnection between modules on a separate chassis.

This invention is directed towards a twisted pair transmission system for interconnecting modules on a common chassis. A copending patent application Ser. No. 381,040, filed by applicant concurrently herewith, entitled "Coaxial Cable Transmission System," describes a transmission line and its associated circuitry for interconnecting modules on separate chassis.

As an example of a high speed digital computer which utilizes the above inventions, see Patent 3,346,851, entitled "Simultaneous Multiprocessing Computer System," by James E. Thornton and Seymour R. Cray.

Therefore, it is an object of this invention to provide a twisted pair transmission system wherein a transistor circuit in one module drives the transistor circuit of another module while operating in the nanosecond time range.

It is another object of this invention to provide a twisted pair transmission system wherein the transmission line is not terminated in its characteristic impedance, resulting in a line mismatch which retards the buildup of noise which would otherwise result from larger ground currents.

Another object of this invention is to provide a twisted pair transmission system wherein the time required for the voltage signal to traverse from one transistor module to another transistor module on a common chassis is dependent upon the delay characteristic of the twisted pair transmission line.

A further object of this invention is to provide a twisted pair transmission system wherein the driving transistor can concurrently drive another transistor on the same module and a transistor located within a module on a common chassis.

These and other objects and the entire scope of the invention will become more fully apparent when considered in light of the following detailed description of an illustrative embodiment of this invention and from the appended claims.

The illustrative embodiment may be best understood by reference to the accompanying drawings wherein.

Figure 1:
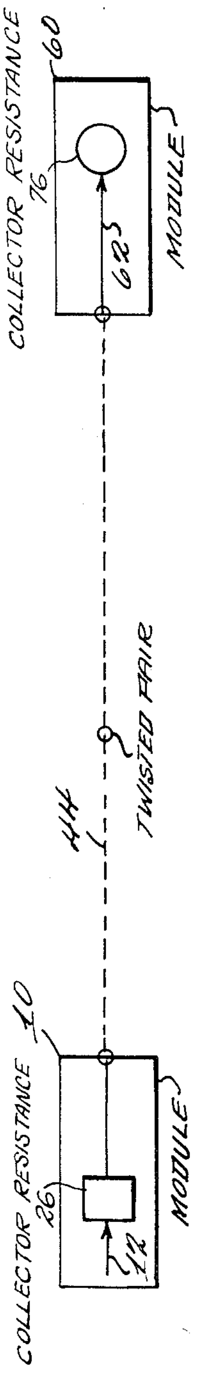
FIGURE 1 is a block diagram illustrating the use of a twisted pair transmission system between modules on a common chassis.

Briefly, the embodiment of the invention shown in FIGURE 1 comprises a twisted pair transmission system which includes a bilevel amplifier driver which has a first and a second output voltage level. The amplifier driver is changeable from the first output level to the second output level by application to the amplifier driver of a control signal. The amplifier driver output voltage is less than the control signal voltage at the first output level and greater than the control signal voltage at the second ouput level. A twisted pair transmission line having a predetermined time delay per unit length characteristic is electrically coupled to the bilevel amplifier driver such that the output level voltage is impressed thereon. The transmission line is clamped at a reference voltage level when the amplifier driver is at its first output level and passes the voltage signal of the amplifier driver at its second output level. The time required for the voltage signal to traverse the transmission line when the amplifier driver output level is changed by the control signal from the first output level to the second output level is precisely determined by the time delay per unit length characteristic of the line.

FIGURE 1 illustrates two typical modules, module 10 and module 60 which have transistor circuits therein. Module 10 and module 60 are located on a common chassis and are interconnected by a twisted pair transmission line 44. Module 10 has a typical transistor circuit comprising a transistor shown as arrow 12 having a collector resistance shown as square 26. The collector resistance 26 is subsequently connected to the twisted pair transmission line 44. The transistor 12 and its associated collector resistance 26 basically comprises the amplifier driver.

Module 60 has a similar transistor shown as arrow 62 and a collector resistance shown as circle 76. When the twisted pair transmission line 44 is activated by the amplifier driver of module 10, the voltage signal will traverse the twisted pair transmission line in a predetermined time and will be recevied by the transistor 62 of module 60. Thereafter, the voltage signal will be applied via the transistor 62 to the collector resistance 76.

Figure 2:
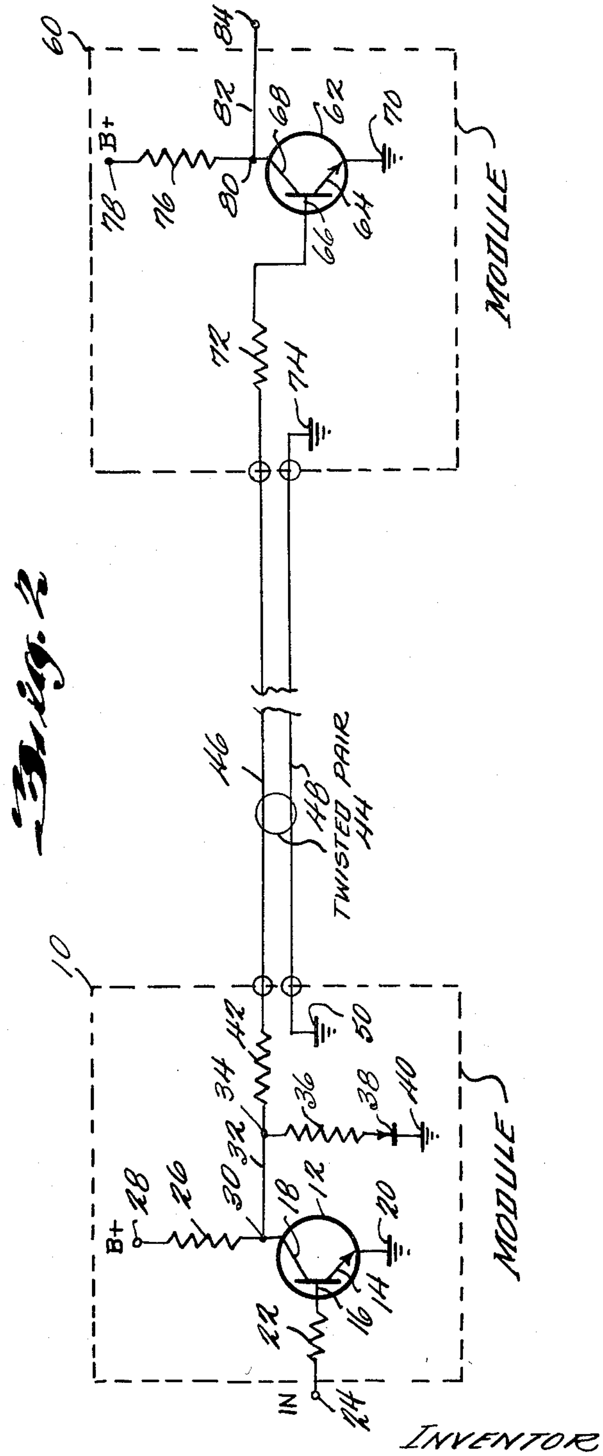
FIGURE 2 is a schematic diagram illustrating the twisted pair transmission system including the twisted pair transmission line, driver transistor and receiver transistor, each transistor located in a separate module on a common chassis.

FIGURE 2 shows the above described transmission system in detail. Module 10 has an NPN transistor 12 having an emitter 14, base 16 and collector 18. The transistor 12 is connected as a grounded emitter amplifier having its emitter 14 connected to a ground 20. The base 16 is connected to one end of a base resistance 22. The other end of base resistance 22 is connected to an input terminal 24 upon which a control signal is applied.

The collector 18 is connected to one end of a collector resistance 26. The other end of collector resistance 26 is connected to +B source of voltage 28. Also connected to the collector 18 at a connecting point 30 is a collector line 32. Collector line 32 is subsequently connected at connecting point 34 to one end of a shuit resistance 36. The other end of shunt resistance 36 is connected to the anode of diode 38. The cathode of diode 38 is subsequently connected to ground 40. Collector line 32 is also connected to one end of a limiting resistance 42. The other end of limiting resistance 42 is connected to one conductor 46 of the twisted pair transmission line 44. Two conductors 46 and 48 make up the twisted pair transmission line 44. The end of conductor 48 which terminates in module 10 is connected to a ground 50.

Module 60 similarly has NPN transistor 62 having an emitter 64, base 66 and a collector 68. Transistor 62 is connected as a grounded emitter amplifier with its emitter 64 connected to ground 72. Base 66 is connected to one end of a base resistance 72. The other end of base resistance 72 is connected to conductor 46 of the twisted pair transmission line 44. The other conductor 48 is connected to a ground 74 within module 60.

The collector 68 is connected to one end of a collector resistance 76. The other end of resistance 76 is connected to a +B voltage source 78. Collector 68 is connected at connecting point 80 to an output line 92. Output line 92 is connected to an output terminal 84 upon which an output signal will appear.

The transistors utilized in the above embodiment have the characteristics as set forth in Table A hereinbelow and are of the type as shown in Table B hereinbelow. The transistor will have two voltage output levels: the first when the transistor is in saturation; and the second when the transistor is cutoff. A transistor of this type may be generally referred to as a bilevel amplifier having a first and a second stable output voltage level. The threshold voltage is to be considered as that voltage $V_b$ between the emitter and the base at which current will begin to conduct.

TABLE A

| Stare | $V_b$(v.) | $V_c$(v.) | $I_b$(ma.) | $I_c$(ma.) |
|---|---|---|---|---|
| Cutoff | .2 | 1.2 | 0 | 0 |
| Saturation | 1.2 | .2 | 1 | 10 |

Average switching time five nanoseconds.

The threshold voltage of the above transistor is +.8 volt. The values of components in a typical embodiment are set forth in Table B hereinafter.

TABLE B

| Element: | Value or type |
|---|---|
| Transistor 12 | Fairchild 1321A. |
| Transistor 62 | Fairchild 1321A. |
| Resistance 22 | 150 ohms. |
| Resistance 26 | 470 ohms. |
| Resistance 36 | 120 ohms. |
| Resistance 42 | 56 ohms. |
| Diode 38 | Threshold +.8 volt Fairchild FD–624. |
| Resistance 72 | 47 ohms. |
| Resistance 76 | 470 ohms. |
| Twisted pair impedance 44 | 110 ohms. |
| Line delay of twisted pair | 1.3 nanoseconds per foot. |
| +B supply voltage | 6 volts. |

For purposes of example only, the above embodiment's operation will be explained using the component values set forth in the above Tables A and B.

Initially, operation of the circuit is commenced with a normal control signal voltage of +1.2 volts applied to the input terminal 24. The +1.2 volts signal is applied to the base 16 of transistor 12 through base resistance 22. The +1.2 volts on the base 16 would drive the transistor into saturation. Current flows from the +B source of 6 volts 28, through collector resistance 26, through collector 18 and emitter 14 to ground 20. The collector 30 at this point would be operating at a +.2 volt. Transistor 12 may generally be described as a bilevel amplifier driver. When Transistor 12 is in this state (saturation), the level of the output voltage shall be referred to as the amplifier driver first output level. It is apparent that the voltage of the amplifier driver first output level is less than the control signal voltage.

With collector 18 at +.2 volt, collector point 30 and collector line 32 will be at a +.2 volt. However, the diode 38 has a threshold voltage characteristic of +.8 volt set forth in Table B. This characteristic allows the diode to conduct when a voltage of +.8 is applied thereon. Conversely, when the voltage is below +.8 volt, the diode is substantially non-conductive. Therefore, the shunt resistance 36 and the connecting point 34 are restricted by diode 38 preventing current flow through the collector line 32 and resistor 36.

Consider now the termination of line 46 in module 60. The base 66 connected to base resistance 72 is biased below threshold at a +.2 volt keeping transistor 62 cutoff. It is apparent that the +.2 volt level is derived from point 30. With transistor 62 cutoff, the twisted pair transmission line 44 is terminated in an open circuit. While transistor 62 is cutoff, the collector 68, output line 82 and output terminal 84 will be held at a +1.2 volts by subsequent similar circuits (not shown) to which output terminal 84 would be connected. Module 60 may generally be described as a bilevel amplifier receiver.

When the bilevel amplifier receiver is in this state (cutoff), the level of the output voltage shall be referred to as the amplifier receiver first output level. It is apparent that the voltage of the amplifier receiver first output level is greater than the transmission line clamped reference voltage.

When a control signal voltage of +.2 volt is applied to the input terminal 24, the bilevel amplifier driver will respond by driving a voltage signal on the transmission line to the bilevel amplifier receiver.

Assume a control signal of +.2 volt is applied to the input terminal 24. This is applied via base resistance 22 to the base 16 of transistor 12. A+.2 volt applied to the base of 16 will drive transistor 12 into cutoff interrupting current flow through the transistor to ground 20. However, the collector 18 will be held at a +1.2 volts by the diode 38. The threshold voltage of diode 38 is +.8 volt and the +1.2 volts of the collector 18 is greater than the diode's threshold. Thus, diode 38 will conduct.

The embodiment utilizing the components as set forth in Table A and Table B will have a predetermined current flowing therethrough, and the resulting current values will be used for purposes of example only.

When diode 38 conducts, approximately 10 ma. will flow through collector resistance 26 and collector line 32. At connecting point 34, the current will divide between the path, including shunt resistance 36 and diode 38, and through the transmission line. Approximately 3.3 ma. of the current will be diverted by the diode 38 to ground 20 via shunt resistance 36. The remaining 6.7 ma. of current will be applied to conductor 46 via limiting resistance 42. Further, the +1.2 volts will be applied between conductors 46 and 48 of the twisted pair transmission line 44.

Summarizing, when the bilevel amplifier driver is in this state (cutoff), the level of the output voltage shall be referred to as the amplifier driver second output level. It is apparent that the voltage of the amplifier driver second output level is greater than the control signal voltage. Further, the voltage of the amplifier driver second output level is sufficient to impress a voltage signal upon the twisted pair transmission line.

When the +1.2 volts and 6.7 ma. signal is applied to the transmission line 44 via the limiting resistance 42, the limiting resistance 42 will weight the voltage amplitude to a smaller value. Referring to Table B, the value of resistance 42 is 56 ohms. Thus, the resulting voltage signal applied on the transmission line from module 10 is +.9 v. at 6.7 ma.

A finite time later, this voltage signal wavefront will reach the end of the transmission line 44 between conductors 46 and 48 and will be applied to base resistance 72 within module 60. The time required for the voltage signal to traverse the transmission line is dependent upon the transmission line delay characteristics; that is the time delay per unit length characteristic of the transmission line. In this embodiment, the typical transmission line is to have a time delay per unit length of 1.3 nansseconds per foot. Thus, the time required for the voltage signal to traverse the transmission line can be precisely controlled. The time at which the voltage signal is to appear at the transmission line termination can be clocked. As an example of when clocking is used, the output of module 60 may be applied to a subsequent AND gate (not shown). Further, additional inputs to this AND gate would emanate from other modules on other chassis. Thus, by controlling the length of the transmission line, or by varying the time delay per unit length characteristics, the time required for a voltage signal to traverse transmission lines from the modules can be precisely clocked for synchronous operation.

When the voltage signal of approximately +.9 volt at 6.7 ma. is received by base resistance 72, this signal is applied to the base 66 of transistor 62. However, the bias at this instant on the base 66 of transistor 66 is a +.2 volt as described previously. The +.2 volt on base 66 algebraically adds to the incoming signal wavefront producing a voltage of +1.1 (.9 v+.2 v.) and a current of 6.7 ma., which will appear on base resistance 72.

Subsequently, the transistor 62 threshold of +.8 volt is exceeded, and transistor 62 is driven into saturation causing current to flow. Current in transistor 62 will flow from the +B supply voltage via collector resistance 76, through collector 68 and emitter 64 to ground 72. Further, base current will flow via base 66 through emitter 64 to ground 70. However, the base current flowing will be limited by base resistance 72 to 2 ma. Further, since the transmission line 44 is terminated in a load which will not absorb all of the transmitted power, a reflected wave will be passed back to the bilevel amplifier driver transistor 12. The reflected wave would have a voltage component of +3 v. (1.1 v.—.8 v.) and a current component of 4.7 ma. (6.7 ma.—2 ma.). The low base current in transistor 62 resulting from the line mismatch retards the build-up of ground noise which would otherwise occur from larger ground currents.

The reflected wave is received by limiting resistance 42 and is shunted to ground 20 via shunt resistance 36 and diode 68. Also, in the absence of diode 38, the line voltage of the transmission line 44 would tend to rise to the +B supply voltage 28 of +6 volts.

Refer again to Module 60 and specifically to the bilevel amplifier receiver transistor 62. The transistor 62 in saturation will be conducting and holding the collector 68, output line 82 and output terminal 84 at a +.2 volt level. The voltage signal impressed on base 66 is a +1.1 volt resulting from the bilevel amplifier driver being driven from its first output level to its second output level by the control signal. Thus, the bilevel amplifier receiver second output level of +.2 volt is less than the +1.1 volt of the transmitted voltage signal.

Summarizing, when the bilevel amplifier receiver is in this state (saturation), the level of the output voltage shall be referred to as the amplifier receiver second output level. It is apparent that the voltage of the amplifier driver second output level is less than the transmitted voltage signal.

Figure 3:
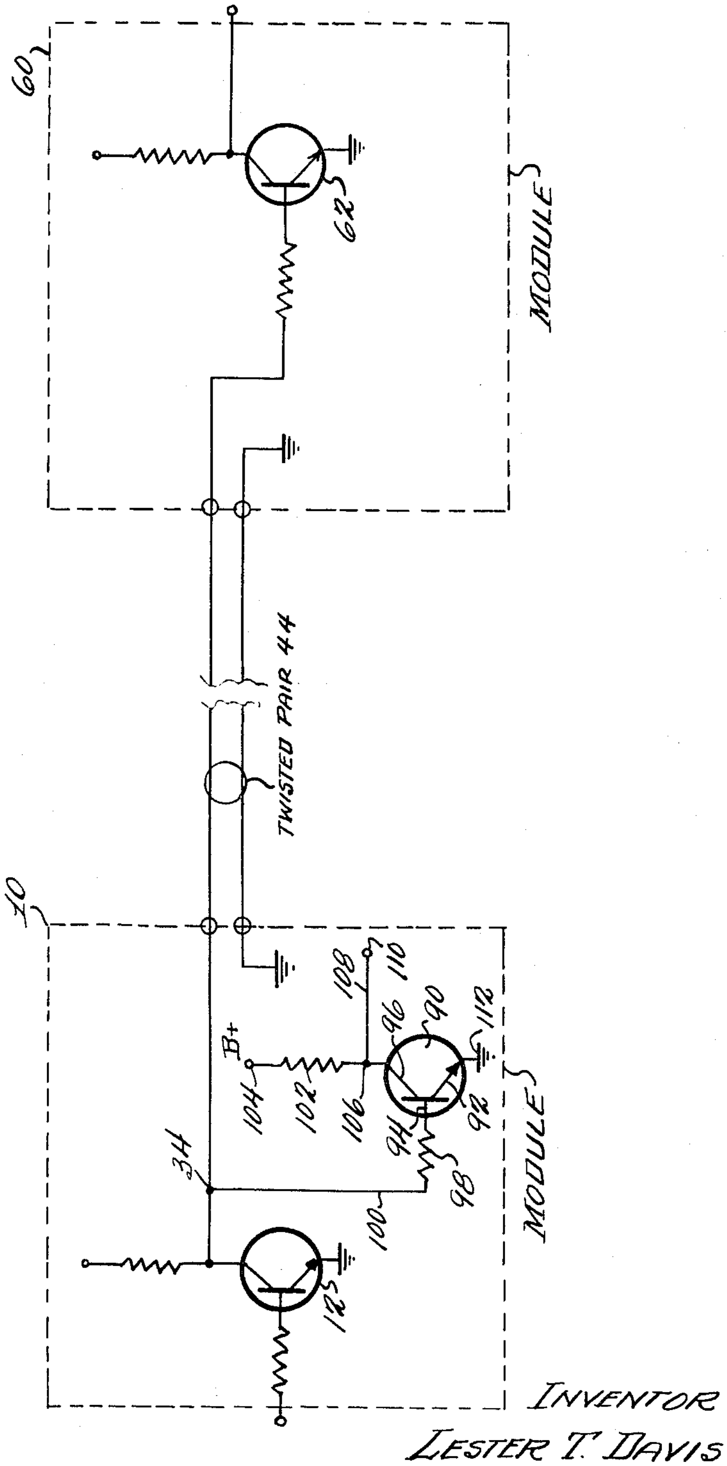
FIGURE 3 is a schematic diagram illustrating the twisted pair transmission system including the twisted pair transmission line, driver transistor concurrently driving a transistor within the same module and a transistor located on a separate module on a common chassis.

The above transmission system can be varied or modified by one skilled in the art; and one modification can easily be made by designing the bilevel amplifier driver to drive a bilevel amplifier receiver within the same module and a bilevel amplifier receiver within a separate module on the common chassis. The modification can easily be made by replacing the shunt resistance 36 and diode 38 with a separate bilevel amplifier receiver. FIGURE 3 shows a typical embodiment utilizing a transistor amplifier in place of the diode 38, which as previously stated, has a threshold of +.8 volt. Therefore, a transistor having the same threshold as the diode 38 may be used. This transistor of course could be similar to the one used either as the bilevel amplifier driver or bilevel amplifier receiver.

Typically, the connecting point 34 as shown in FIGURES 2 and 3 would be utilized. Considering only point 34 in FIGURE 3, NPN transistor 90 having an emitter 92, base 94 and collector 96 would be the bilevel amplifier receiver. Transistor 90 would be connected as a grounded emitter amplifier with emitter 92 connected to a ground 112. The base 94 would be connected to one end of a base resistance 98. The other end of base resistance 98 would be connected to the connecting point 34 via line 100. The collector 96 would be connected to one end of a collector resistance 102. The other end of collector resistance 102 would be connected to a +B supply voltage. Also connected to collector 96 at connecting point 106 would be a connecting line 108 to output terminal 110 all within module 10.

The bilevel amplifier receiver in module 10 would have a first and a second output level which corresponds with the first and second levels of the bilevel amplifier receiver in module 60. Further, the output levels of each receiver will be driven to the same output level by the bilevel amplifier driver.

It will be understood that any appropriate bilevel amplifier driver and bilevel amplifier receiver may be utilized with the inventive twisted pair transmission system.

The above illustrative embodiment comprises a preferred embodiment of the invention. However, this illustrative embodiment is not intended to limit the possibilities of insuring the features of the twisted pair transmission system. The transmission system disclosed herein is an example of a arrangement in which the inventive features of this disclosure may be utilized and it will become apparent to one skilled in the art that certain modifications may be made within the spirit of the invention defined by the appended claims.

What is claimed is:

1. A twisted pair transmission system comprising:

(a) a bilevel amplifier driver having a non-linear impedance network shunted across its output, said non-linear impedance network presenting a high impedance to low-level output signals and a low impedance to high-level output signals;

(b) a twisted pair transmission line directly coupled to the bilevel amplifier driver output circuit; and (c) a bilevel amplifier receiver having an input circuit directly coupled to the twisted pair transmission line and having an input impedance which is greater than the transmission line characteristic impedance whereby a substantial portion of a received electrical wavefront will be reflected back along the transmission line.

2. A twisted pair transmission system as set forth in claim 1 wherein the impedance of the non-linear impedance network during the transmission of a high-level output signal is approximately equal to the transmission line characteristic impedance.

3. A twisted pair transmission system as set forth in claim 1 wherein the bilevel amplifier driver and bilevel amplifier receiver each comprise at least one transistor stage.

4. A twisted pair transmission system as set forth in claim 1 wherein the non-linear impedance network comprises at least one diode.

5. A twisted pair transmission system as set forth in claim 1 wherein the non-linear impedance network comprises an input circuit to a shunt amplifier.

References Cited

UNITED STATES PATENTS

| | | | |
|---|---|---|---|
| 3,140,405 | 7/1964 | Killing | 333—12 X |
| 3,170,038 | 2/1965 | Johnson et al. | |
| 3,281,694 | 10/1966 | Clark. | |

ROY LAKE, *Primary Examiner.*

N. KAUFMAN, *Examiner.*